United States Patent [19]

Johnson

[11] Patent Number: 4,596,937

[45] Date of Patent: Jun. 24, 1986

[54] DIGITAL PHASE-LOCKED LOOP

[75] Inventor: Kenneth C. Johnson, Cheadle, United Kingdom

[73] Assignee: International Computers Limited, London, England

[21] Appl. No.: 481,582

[22] Filed: Apr. 1, 1983

[30] Foreign Application Priority Data

Apr. 28, 1982 [GB] United Kingdom ................. 8212264

[51] Int. Cl.$^4$ ........................... H03L 7/00; H03D 3/24
[52] U.S. Cl. ..................................... 307/269; 307/262; 328/63; 328/133; 328/155; 331/1 A; 375/120
[58] Field of Search .................. 328/155, 63, 133, 134, 328/14; 331/1 A, 25; 375/119, 120; 307/269, 510, 262, 511, 440, 445, 479

[56] References Cited

U.S. PATENT DOCUMENTS 3,363,183  1/1968  Bowling et al. ....................... 328/63
4,216,544  8/1980  Boleda et al. ....................... 375/119
4,222,009  9/1980  Moulton et al. ....................... 328/72
4,280,099  7/1981  Rattlingourd ....................... 328/63

FOREIGN PATENT DOCUMENTS 1152210  10/1966  United Kingdom .
1456453   1/1974  United Kingdom .
2119188  11/1983  United Kingdom .

*Primary Examiner*—Stanley D. Miller
*Assistant Examiner*—Richard Roseen
*Attorney, Agent, or Firm*—Lee, Smith & Zickert

[57] ABSTRACT

A phase locked loop system for receiving a data input with a predetermined bit frequency includes a source (10 $D_1$ $D_2$) of clock signals with a frequency nominally equal to the bit frequency of the data signal means (12,13,14,15,16) for dividing each clock period into three regions corresponding to early, normal and late arrival of the data signal relative to the clock signal and means ($D_3$ $D_4$ $D_5$) for deciding which region the data signal occurs in and for respectively advancing or retarding the phase of the clock signal if the data signal occurs in the early or later region.

4 Claims, 3 Drawing Figures

DIGITAL PHASE-LOCKED LOOP

BACKGROUND TO THE INVENTION

This invention relates to digital phase-locked loops. A phase-locked loop (PLL) is a device which is arranged to receive an input data signal and to produce an output clock signal having the same frequency and locked in phase to the input data. Such devices find application, for example, in data transmission systems or in magnetic recording.

One previously proposed digital PLL comprises a divide-by-n counter which is driven by an oscillator at n times the bit frequency of the input data, and produces one output clock pulse for each complete cycle of the counter. The clock signal is locked in phase to the incoming data by causing the data pulses to reset the counter to a predetermined state.

However, one problem with this form of PLL is that if the incoming data gets significantly out of phase with the clock signal (i.e. in the region of 180° out of phase), the PLL may fail to operate correctly since it may not be able to decide whether the data is early or late with respect to the clock. One object of the present invention is to provide a novel digital PLL in which this problem is overcome.

SUMMARY OF THE INVENTION

According to the invention, a digital phase-locked loop for receiving an input data signal having a predetermined bit frequency, comprises:

(a) means for producing a clock signal having a frequency nominally equal to the bit frequency of the input data signal, (b) means for producing three control pulses in each clock period, thereby dividing each clock period into three regions corresponding to early, normal and late arrival of the input data signal relative to the clock signal, and (c) means for deciding which region the input data signal occurs in, and for respectively advancing or retarding the phase of the clock signal if the input data signal occurs in the early or late region.

It will be seen that dividing the clock cycle into three regions in this way ensures that there is never any ambiguity as to whether the data signal is early or late.

One embodiment of the invention will now be described, by way of example, with reference to the accompanying drawings.

DESCRIPTION OF AN EMBODIMENT OF THE INVENTION

Figure 1:
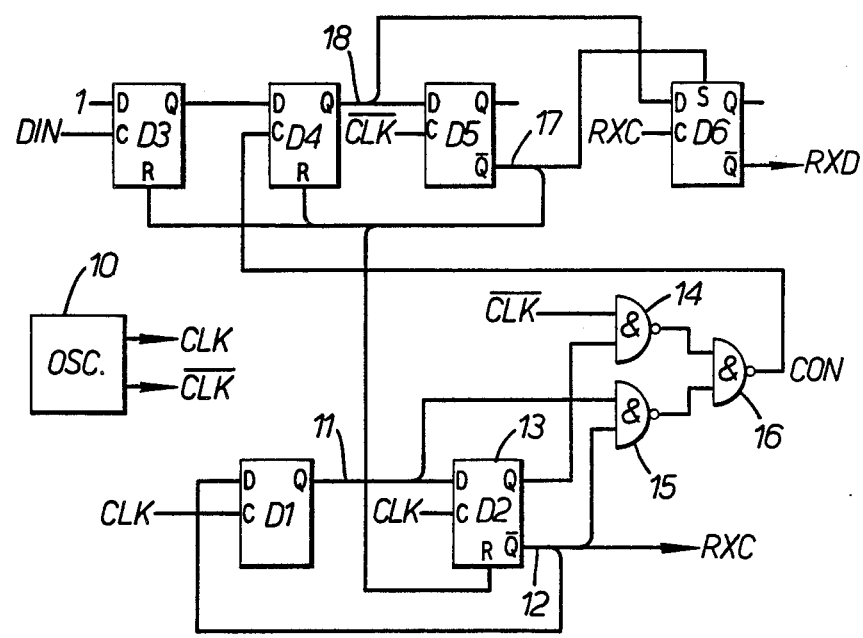
FIG. 1 is a circuit diagram of a digital PLL.

Referring to FIG. 1, the PLL receives an input data signal DIN having a bit frequency of 1 MHz, each bit period containing either a positive-going pulse representing a binary zero, or no pulse, representing a binary one. The PLL produces an output clock signal RXC of the same frequency, locked in phase to the data signal. The PLL also re-times the data signal DIN to synchronise it with output clock signal RXC, producing an output data signal RXD.

The circuit includes a crystal oscillator 10 producing a square wave input clock signal CLK and its inverse, $\overline{CLK}$ having a frequency of 4 MHz, i.e. four times the bit frequency of the input data signal.

Figure 2:
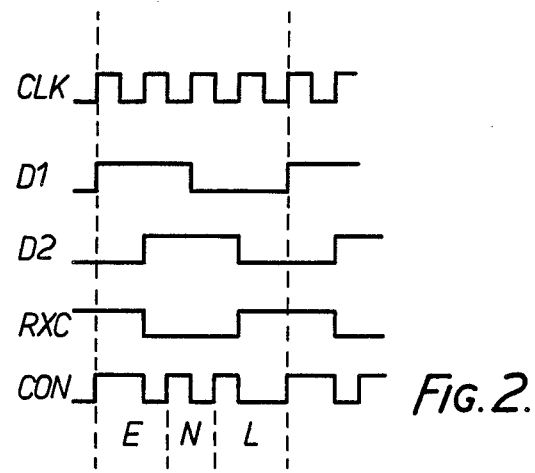
FIGS. 2 and 3 show the waveforms of various signals illustrating the operation of the PLL.

The clock signal CLK is applied to the clock inputs of two D-type bistables D1 and D2, so that each bistable is triggered by the rising edge of a pulse of the input clock signal CLK. The normal output 11 of bistable D1 is connected to the data input of bistable D2, while the inverse output 12 of bistable D2 is connected to the data input of bistable D1. The two bistables D1 and D2 thus form a divide-by-four counter ($D_1D_2$) with a cycle of four periods of the input clock signal CLK. The clock signal CLK and the states of the bistables D1, D2 are shown in FIG. 2. The inverse output 12 of bistable D2 provides the output clock signal RXC.

The normal output 13 of bistable D2 is combined with the inverse clock signal $\overline{CLK}$ in a NAND gate 14, while the inverse output 12 of the bistable D2 is combined with the normal output 11 of bistable D1 in a NAND gate 15. The outputs of these two gates are combined in a further NAND gate 16 to form a control signal CON obeying the equation:

CON=(D1 AND RXC) OR (D2 AND $\overline{CLK}$).

The resulting waveform of the control signal CON is shown in FIG. 2. It can be seen that the control signal CON contains three pulses for every cycle of the counter $D_1 D_2$ and hence divides each period of output clock signal RXC into three regions E, N and L, the boundaries of which are defined by the rising edges of the pulses of the control signal CON. These three regions correspond respectively to early, normal and late arrival of the leading edge of a data pulse with respect to the output clock signal RXC.

The PLL also includes three further D-type bistables D3, D4 and D5 connected in series. Bistable D3 receives the data signal DIN at its clock input and has a constant high logic level applied to its data input. Bistable D4 is clocked by the control signal CON, while bistable D5 is clocked by the inverse of the input clock signal CLK. The inverse output 17 of bistable D5 is connected to the CLEAR inputs of bistables D2, D3 and D4 so that whenever bistable D5 is set, the low logic level at the output 17 forces bistables D2, D3 and D4 into their unset states.

Figure 3:
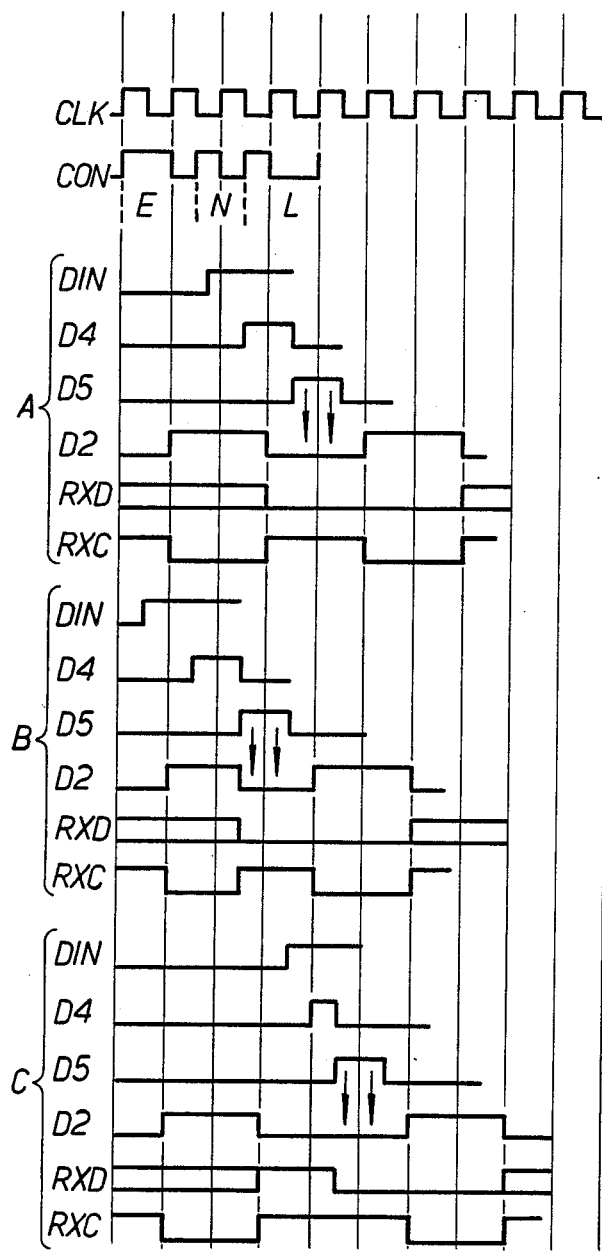

The operation of the PLL is illustrated in FIG. 3. Whenever a data pulse is received, bistable D3 is set immediately, and bistable D4 is set at the first rising edge of control signal CON after this. Bistable D5 is then set at the next rising edge of the inverse clock signal $\overline{CLK}$. The setting of bistable D5 unsets bistables D3 and D4, and bistable D4 then causes bistable D5 to be unset again one period of the inverse clock signal $\overline{CLK}$ later. The set state of bistable D5 also forces bistable D2 into the unset state i.e. forces the output clock signal RXC to the high level.

FIG. 3A shows the normal situation in which the output clock signal RXC is substantially synchronised with the data input signal DIN, such that the leading edge of each data pulse falls somewhere in the normal region N. It can be seen that in this case the set state of bistable D5 falls entirely within the unset state of bistable D2. Hence, the low level from the output 17 of bistable D5 has no effect on bistable D2, since bistable D2 is already unset. Thus, there is no adjustment of the phase of the counter D1, D2 in this case.

FIG. 3B shows what happens if the output clock signal RXC gets out of phase with the incoming data signal DIN such that the leading edge of a data pulse falls somewhere within the early region E. It can be seen that in this case the set state of bistable D5 occurs one period of CLK earlier than in the normal case. The low level from the inverse output 17 of bistable D5 therefore forces bistable D2 into its unset state. This effectively steps counter D1, D2 forward by one state, and thus advances the phase of the output clock signal RXC by 90°, bringing it more closely into synchronism with the incoming data.

FIG. 3C shows what happens if the leading edge of a data pulse falls somewhere within the late region L. It can be seen that in this case the set state of bistable D5 occurs one period of the input clock signal CLK later than in the normal case. The low level from the inverse output 17 of bistable D5 thus holds bistable D2 in the unset state. This effectively prevents the counter D1, D2 from advancing one state, and therefore retards the phase of output clock signal RXC by 90°, bringing it more closely into synchronism with the incoming data.

The data output signal RXD is obtained from the inverse output of a further D-type bistable D6. This bistable has the signal output clock signal RXC connected to its clock input, the normal output 18 of bistable D4 connected to its data input, and the inverse output 17 of bistable D5 connected to its PRESET input.

The effect of this is shown in FIG. 3. It can be seen that in each case, whether the data arrives in the normal, early or late regions, the bistable D6 converts the incoming pulsed input data signal DIN into the output data signal RXD which has a low level for each positive-going pulse in data signal DIN and a high level for each bit period in which no pulse is received. The output clock signal RXC provides the necessary timing information for sampling this signal, the falling edge of the output clock signal RXC occurring at or near the mid-point of each bit period of output data signal RXD. Thus the output clock signal may be used on the clock signal for demodulators or other arrangements for operating upon or using the output data signal RXD.

I claim:

1. A digital phase-locked loop for receiving an input data signal having a predetermined bit frequency, comprising:
    (a) means for producing a clock signal having a frequency nominally equal to the bit frequency of the input data signal,
    (b) means responsive to the clock signal for producing a control signal containing three control pulses in each clock period, thereby dividing each clock period into three regions corresponding to early, normal and late arrival of the data signal relative to the clock signal,
    (c) means responsive to the control signal for deciding which region the data signal occurs in, and for advancing the clock signal by 90° in phase if the data signal occurs in the early region and retarding the clock signal by 90° in phase if the data signal occurs in the late region, and
    (d) means for outputting said clock signal coupled to said means for deciding.

2. A digital phase-locked loop for receiving an input data signal having a predetermined bit frequency, comprising:
    (a) oscillator means for producing a first clock signal having a frequency nominally equal to n times the bit frequency of the input data,
    (b) counter means responsive to the first clock signal, for dividing the frequency of the first clock signal by n to produce a second clock signal having a frequency nominally equal to the bit frequency of the input data,
    (c) means responsive to the second clock signal for producing a control signal containing three control pulses in each period of the second clock signal, thereby dividing each period of the second clock signal into three regions corresponding to early, normal and late arrival of the data signal relative to the second clock signal,
    (d) means responsive to the input data signal and to a first occurrence of any one of said three control pulses following the input data signal, for producing a resetting pulse of predetermined duration delayed by a predetermined amount with respect to any one of said three control pulses,
    (e) means for applying the resetting pulse to the counter means to reset the counter means, thereby advancing the second clock signal by 90° in phase if the data signal occurs in the early region and retarding the second clock signal by 90° in phase if the data signal occurs in the late region, and
    (f) means for outputting said second clock signal coupled to said means for applying.

3. A phase-locked loop according to claim 2 wherein the counter comprises first and second bistables each having a clock input, a data input, a normal output and an inverted output, the bistables being so connected that the normal output of the first bistable is connected to the data input of the second bistable and the inverted output of the second bistable is connected to the data input of the first bistable whereby the counter has a cycle of four states, and the clock inputs of both bistables being connected to receive said first clock signal.

4. A phase-locked loop according to claim 3, wherein the means for producing the control pulses comprises gating means for producing a control pulse when the first bistable is set and the second bistable unset, or when the second bistable is set and the first clock signal which drives the counter is at a low logic level.

* * * * *